(12) United States Patent
Cyrusian (10) Patent No.: US 9,503,069 B1
(45) Date of Patent: Nov. 22, 2016

(54) SELF RESETTING LATCH (71) Applicant: Marvell International Ltd., Hamilton (BM)

(72) Inventor: Sasan Cyrusian, Scotts Valley, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 0 days.

(21) Appl. No.: 14/671,290

(22) Filed: Mar. 27, 2015

Related U.S. Application Data (60) Provisional application No. 61/972,985, filed on Mar. 31, 2014.

(51) Int. Cl.
*H03K 3/02* (2006.01)
*H03K 5/24* (2006.01)
*H03M 9/00* (2006.01)
*H03M 1/12* (2006.01)

(52) U.S. Cl.
CPC .................. *H03K 5/24* (2013.01); *H03M 1/12* (2013.01); *H03M 9/00* (2013.01)

(58) Field of Classification Search
CPC ....................................................... H03K 5/24
See application file for complete search history.

(56) References Cited

U.S. PATENT DOCUMENTS

| 6,225,937 B1 * | 5/2001 | Butler | H03M 1/0872 341/118 |
| 2012/0161874 A1 * | 6/2012 | Tsai | G05F 3/30 330/277 |

* cited by examiner

*Primary Examiner* — Daniel Puentes (57) ABSTRACT

An apparatus includes first and second input transistors receiving respective first and second input signals, and a feedback circuit coupled to the first and second input transistors. The first and second input transistors provide first and second nodes with first and second currents according to values of the first and second input signals, respectively, when the feedback circuit is turned on. The first and second input transistors produce a reset value on the nodes when the feedback circuit is turned off. A method includes resetting, using first and second input transistors, respectively, values of first and second nodes to a reset value, providing first and second currents to the nodes using the first and second input transistors according to values of first and second input signals, and determining the values of the nodes according to the values of the first and second input signals.

20 Claims, 5 Drawing Sheets

SELF RESETTING LATCH

CROSS REFERENCE TO RELATED APPLICATION

This present disclosure claims the benefit of U.S. Provisional Application No. 61/972,985, filed on Mar. 31, 2014, which is incorporated by reference herein in its entirety.

BACKGROUND

An analog comparator receives first and second analog signals and produces an output signal according to respective voltage values of the first and second analog signal. The output signal has a first value, such as '0', when the voltage value of the first analog signal is less than the voltage value of the second analog signal plus an offset voltage. The output signal has a second value, such as '1', when the voltage value of the first analog signal is greater than the voltage value of the second analog signal plus the offset voltage.

The analog comparator may perform the comparison of the values of the first and second analog signals at a time determined according to a clock signal. The analog comparator may latch the result of the comparison, and therefore function as a latch.

The comparator may be used, among other applications, in a Serializer/Deserializer (SERDES) receiver circuit or an Analog to Digital Converter (ADC) circuit. The ADC circuit may include any of a flash ADC, a sigma-delta ADC, a successive approximation ADC, an interleaved ADC, a single-slope or multi-slope ADC, and the like.

SUMMARY

In an embodiment, an apparatus includes a first input transistor having a control terminal configured to receive a first input signal, a second input transistor having a control terminal configured to receive a second input signal, and a feedback circuit coupled to the first and second input transistors. The first and second input transistors are configured to provide, to first and second nodes, first and second currents according to values of the first and second input signals, respectively, when the feedback circuit is turned on. The first and second input transistors are configured to produce a reset value on the first and second nodes, respectively, when the feedback circuit is turned off.

In an embodiment, the apparatus further includes an enable transistor configured to control whether the feedback circuit is turned on or turned off, and first and second cross-coupled transistors configured to provide feedback. The first and second cross-coupled transistors are part of the feedback circuit.

In an embodiment, the first and second input transistors are first conductivity type transistors, the first and second cross-coupled transistors are second conductivity type transistors, and the first conductivity type is different from the second conductivity type.

In an embodiment, the reset value corresponds to a voltage value of a supply voltage provided to the first and second input transistors.

In an embodiment, the first input signal has a value according to a bias voltage and a first received signal, and the second input signal has a value according to the bias voltage and a second received signal.

In an embodiment, the first input signal has a value according to a first calibration signal.

In an embodiment, the bias voltage is produced using a first transistor replica that is substantially identical to the first input transistor.

In an embodiment, the bias voltage is produced using a programmable current source coupled to the first transistor replica.

In an embodiment, a supply voltage circuit provides, to the first and second input transistors, a power supply voltage having a voltage value according to a voltage value of the second input signal and a value of a reference current.

In an embodiment, a value of the power supply voltage is equal to a sum of the voltage value of the second input signal and a voltage drop across a first replica transistor. The voltage drop across the first replica transistor is produced according to the value of the reference current, and the first replica transistor is substantially identical to the second input transistor.

In an embodiment, the voltage value of the second input signal is a reference voltage value.

In an embodiment, the feedback circuit is a first positive feedback circuit, and wherein the reset value is a first reset value, and the apparatus further includes a third input transistor having a control terminal configured to receive a first output signal from the first node of the first positive feedback circuit, a fourth input transistor having a control terminal configured to receive a second output signal from the second node of the first positive feedback circuit, and a second positive feedback circuit coupled to the third and fourth input transistors and configured to be turned on and turned off. The third and fourth input transistors are configured to provide, to third and fourth nodes, third and fourth currents according to values of the first and second output signals, respectively, when the second positive feedback circuit is turned on, and to produce a second reset value on the third and fourth nodes when the second positive feedback circuit is turned off. The first and second input transistors are first conductivity type transistors, the third and fourth input transistors are second conductivity type transistors, and the first conductivity type is different from the second conductivity type.

In an embodiment, the apparatus is included in a Serializer/Deserializer (SERDES) receiver circuit.

In an embodiment, the apparatus is included in an Analog to Digital Converter (ADC) circuit.

In an embodiment, a method includes resetting, using first and second input transistors, respectively, values of first and second nodes to a reset value, providing first and second currents to the first and second nodes, using the first and second input transistors, respectively, according to values of first and second input signals applied to control terminals of the first and second input transistors, and determining the values of the first and second nodes according to the values of the first input signal and the second input signal.

In an embodiment, the values of the first and second nodes are determined based on whether the value of the first input signal is greater than the value of the second input signal, wherein the reset value is a first reset value, and the method includes resetting values of third and fourth nodes to a second reset value using third and fourth input transistors, respectively, providing, using the third and fourth input transistors, respectively, third and fourth currents to the third and fourth nodes according to the values of the first and second nodes, and determining the values of the third and fourth nodes according to whether the value of the first input signal is greater than the value of the second input signal.

In an embodiment, the first and second input transistors are a first conductivity type transistors, the third and fourth input transistors are a second conductivity type transistors, and the first conductivity type is different from the second conductivity type.

In an embodiment, the method includes turning off a positive feedback circuit, and turning on the positive feedback circuit. The positive feedback circuit is coupled to the first and second input transistors. Values of the first and second output signals are reset when the positive feedback circuit is off. First and second currents are provided to the first and second nodes and the values of the first and second nodes are determined according to whether the value of the first input signal is greater than the value of the second input signal when the positive feedback circuit is on.

In an embodiment, the method includes providing the first and second input signals according to first and second received signals, respectively, and a bias voltage.

In an embodiment, the method includes determining a voltage value of a power supply signal according to a value of the second input signal and a voltage value of a bias voltage, and providing the power supply signal to conduction terminals of the first and second input transistors.

DETAILED DESCRIPTION

Figure 1A:
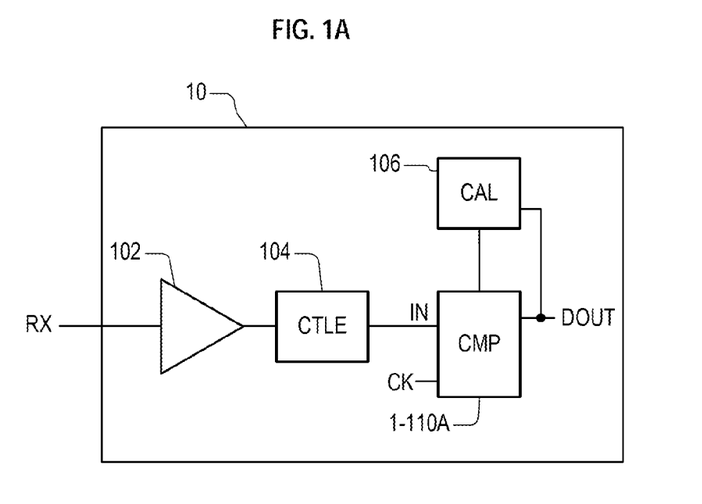
FIGS. 1A and 1B illustrate electronic devices each including a comparator according to an embodiment.
Figure 1B:
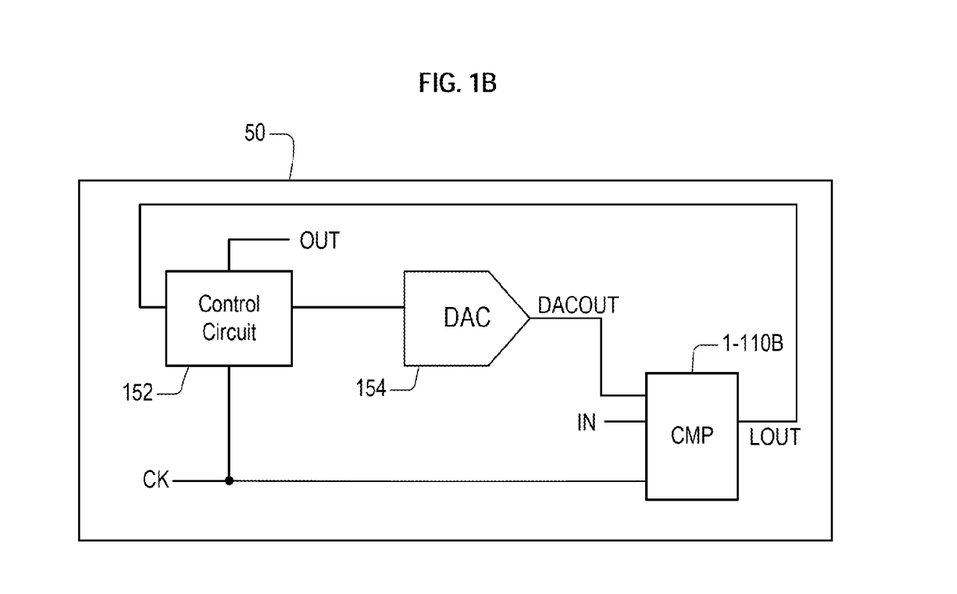

FIGS. 1A and 1B illustrate first and second electronic devices 10 and 50 according to an embodiment. Embodiments of the first and second electronic devices 10 and 50 may be provided in an integrated circuit. In an embodiment, the first and second electronic devices 10 and 50 employ comparator circuits 1-110A and 1-110B, respectively, that use a relatively few transistors and are configured to perform a self-resetting process.

The first electronic device 10 shown in FIG. 1A includes a Serializer/Deserializer (SERDES) receiver circuit including an amplifier 102, a continuous time linear equalizer (CTLE) 104, a calibration circuit 106, and a comparator circuit 1-110A. A person of ordinary skill in the art in light of the teachings and disclosures herein would understand that the first electronic device 10 may include other circuits known in the art, such as clock generation circuits, clock recovery circuits, power supply circuits, and the like, which are omitted in the interest of brevity.

The amplifier 102 and the CTLE 104 are configured to produce an input signal IN by amplifying and equalizing a received signal RX. In an embodiment, the received signal RX, the input signal IN, or both are differential signals. A person of skill in the art in light of the teachings and disclosures herein would understand how to implement the amplifier 102 and the CTLE 104.

The comparator circuit 1-110A is configured to produce a data out signal DOUT according to a value of the input signal IN at a time according to a clock signal CK.

In an embodiment, the input signal IN is a differential signal having plus and minus signals. The comparator circuit 1-110A produces the data out signal DOUT having a first value, such as a '0', when a voltage value of the plus signal of the input signal IN is less than a voltage value of the minus signal of the input signal IN. The comparator circuit 1-110A produces the data out signal DOUT having a second value, such as a '1', when the voltage value of the plus input of the input signal IN is greater than the voltage value of the minus signal of the input signal IN.

In another embodiment, the comparator circuit 1-110A produces the data out signal DOUT having the first value when a voltage value of the input signal IN is less than a reference voltage value. The comparator circuit 1-110A produces the data out signal DOUT having the second value when the voltage value of the input signal IN is greater than the reference voltage value.

The calibration circuit 106 is configured to provide one or more calibration signals to the comparator circuit 1-110A. The calibration signals are adapted to correct differences, such as threshold voltage differences, that may arise from environmental and manufacturing variations related to the components of the comparator circuit 1-110A, as will be described below. In an embodiment, the calibration circuit 106 performs a calibration process according to a value of the data out signal DOUT.

The second electronic device 50 shown in FIG. 1B includes an Analog to Digital Converter circuit (ADC) including a control circuit 152, a Digital to Analog Converter circuit (DAC) 154, and a comparator circuit 1-110B. The ADC of the second electronic device 50 may be, for example, a successive approximation ADC, a ramp-compare ADC, or a delta-encoded ADC.

The control circuit 152 and comparator circuit 1-110B receive a clock signal CK. The comparator circuit 1-110B receives an analog input signal IN at a first input.

During a first clock cycle of the clock signal CK, the control circuit 152 controls the DAC 154 to provide, to a second input of the comparator circuit 1-110B, a DAC output signal DACOUT having a first voltage value. The comparator circuit 1-110B produces a comparator output signal LOUT having a first logical value according to a comparison of the first voltage value to a voltage value of the analog input signal IN.

During a second clock cycle of the clock signal CK, the control circuit 152 controls the DAC 154 to provide the DAC output signal DACOUT having a second voltage value. The second voltage value may be less than, greater than, or equal to the first voltage value according to the first logical value of the comparator output signal LOUT and the type of the ADC converter included in the second electronic device 50. The comparator circuit 1-110B produces the comparator output signal LOUT having a second logical value according to a comparison of the second voltage value to the voltage value of the analog input signal IN.

The operations of the second clock cycle are repeated in subsequent clock cycles of the clock signal CK until the conversion is complete. When the conversion is complete, the control circuit 152 produces an output signal OUT having the digital value.

A person of skill in the art in light of the teachings and disclosures herein would understand how to implement the control circuit 152 and the DAC 154, and that the ADC of the second electronic device 50 may include other circuits. Although the configuration of the ADC of the electronic device 50 encompasses some specific types of ADCs, embodiments are not limited thereto.

Figure 2:
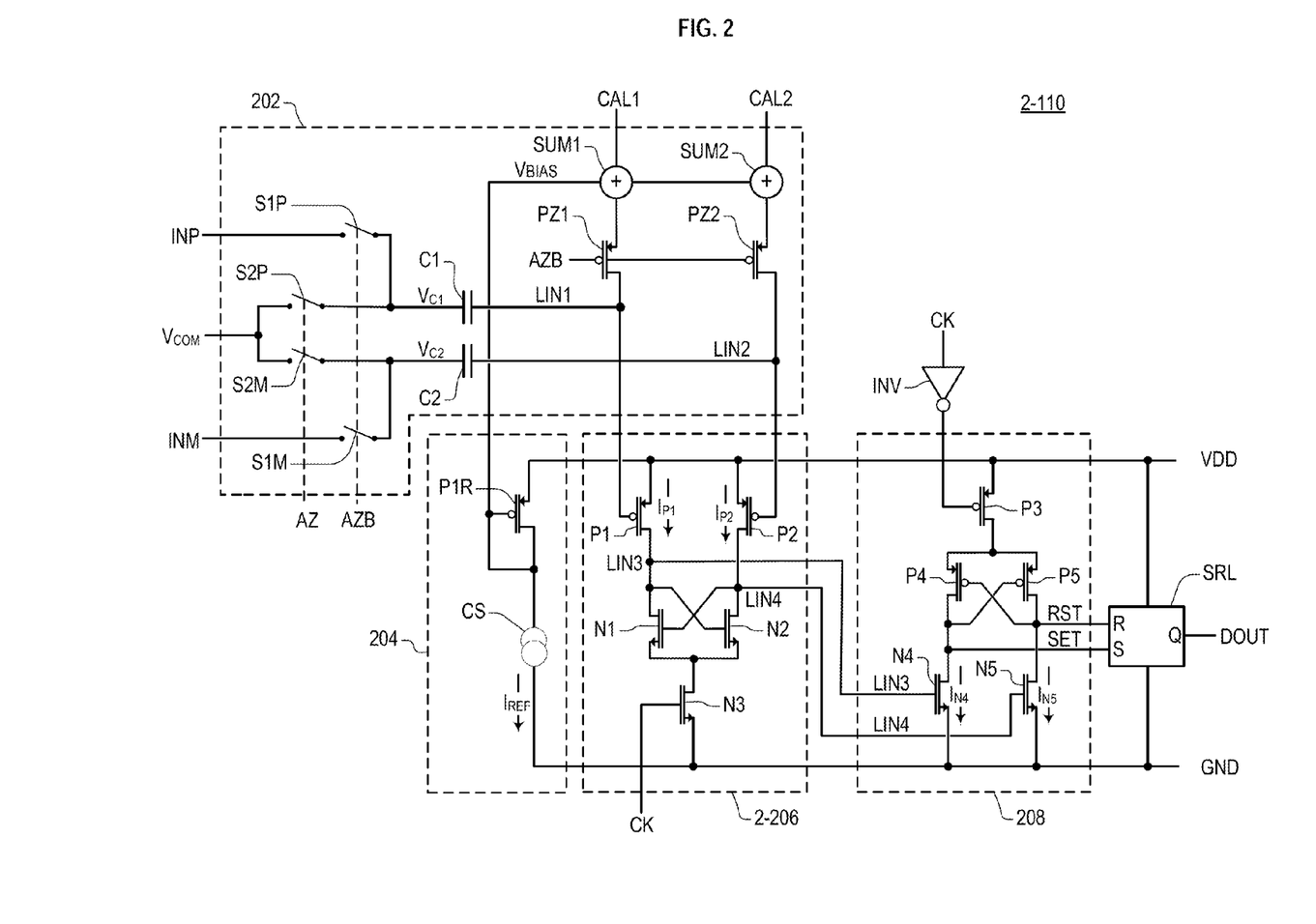
FIG. 2 is a schematic of a comparator circuit suitable for use in the electronic devices of FIGS. 1A and 1B according to an embodiment.

FIG. 2 is a schematic of a comparator circuit 2-110 suitable for use as the comparator 1-110A of FIG. 1A or as the comparator 1-110B of FIG. 1B, according to an embodiment. The comparator circuit 2-110 includes an auto-zeroing input circuit (or input circuit) 202, a bias voltage generation circuit 204, a first clocked positive feedback latch stage (or first latch stage) 2-206, a second clocked positive feedback latch stage (or second latch stage) 208, and a set-reset latch SRL.

The input circuit 202 is controlled according to an auto-zero signal AZ and an auto-zero complement signal AZB. The auto-zero complement signal AZB is a complementary signal of the auto-zero signal AZ, that is, the auto-zero complement signal AZB has a first value when the auto-zero signal AZ has a second value, and has the second value when the auto-zero signal AZ has the first value.

The input circuit 202 receives plus and minus input signals INP and INM and first and second calibration signals CAL1 and CAL2. In an embodiment, the plus and minus input signals INP and INM are received from the CTLE 104 of FIG. 1A and the first and second calibration signals CAL1 and CAL2 are received from the calibration circuit 106 of FIG. 1A.

The input circuit 202 produces first and second latch input signals LIN1 and LIN2 according to the plus and minus input signals INP and INM, a bias voltage $V_{BIAS}$, and the first and second calibration signals CAL1 and CAL2.

The input circuit 202 includes first and second plus switches S1P and S2P, first and second minus switches S1M and S2M, first and second capacitors C1 and C2, first and second summing circuits SUM1 and SUM2, and first and second zeroing switches PZ1 and PZ2. In an embodiment, the first and second plus and minus switches S1P, S2P, S1M, and S2M each include one or more transistors, such as Metal Oxide Semiconductor Field Effect Transistors (MOSFETs), Junction FETs (JFETs), Bipolar Junction Transistors (BJTs), and the like.

The first plus switch S1P is connected between the plus input signal INP and a first terminal of the first capacitor C1, and is controlled by the auto-zero complement signal AZB. The second plus switch S2P is connected between a common voltage $V_{COM}$ and the first terminal of the first capacitor C1, and is controlled by the auto-zero signal AZ.

When the auto-zero signal AZ has a first value, e.g. as a high value, the first plus switch S1P is turned off, the second plus switch S2P is turned on, and a value of the common voltage $V_{COM}$ is provided to the first terminal of the first capacitor C1. When the auto-zero complement signal AZB has the high value, the first plus switch S1P is turned on, the second plus switch S2P is turned off, and a value of the plus input signal INP is provided to the first terminal of the first capacitor C1.

The first minus switch S1M is connected between the minus input signal INM and a first terminal of the second capacitor C2, and is controlled by the auto-zero signal complement AZB. The second minus switch S2M is connected between the common voltage $V_{COM}$ and the first terminal of the second capacitor C2, and is controlled by the auto-zero signal AZ.

When the auto-zero signal AZ has a first value, e.g. as a high value, the first minus switch S1M is turned off, the second minus switch S2M is turned on, and a value of the common voltage $V_{COM}$ is provided to the first terminal of the second capacitor C2. When the auto-zero complement signal AZB has the high value, the first minus switch S1M is turned on, the second minus switch S2M is turned off, and a value of the minus input signal INM is provided to the first terminal of the second capacitor C2.

In other words, when the auto-zero signal AZ has a high value, the value of the common voltage $V_{COM}$ is provided to the first terminals of the first and second capacitors C1 and C2. When the auto-zero complement signal AZB has the high value, the value of the plus and minus input signals INP and INM are provided to the first terminals of the first and second capacitors C1 and C2, respectively. In an embodiment, no more than one of the auto-zero signal AZ and the auto-zero complement signal AZB has the high value at any given time.

Second terminals of the first and second capacitors C1 and C2 are connected to first conduction terminals of the first and second zeroing switches PZ1 and PZ2 to provide first and second latch input signals LIN1 and LIN2, respectively.

Second conduction terminals of the first and second zeroing switches PZ1 and PZ2 are connected to output signals of the first and second summing circuits SUM1 and SUM2, respectively. Respective control terminals of the first and second zeroing switches PZ1 and PZ2 are connected to the auto-zero complement signal AZB.

In an embodiment, the first and second zeroing switches PZ1 and PZ2 respectively include a p-channel MOSFET (pMOSFET) having a drain connected to the respective first conduction terminal, a source connected to the respective second conduction terminal, and a gate connected to the auto-zero complement signal AZB.

The first summing circuit SUM1 produces the output signal having a value equal to a sum of a value of the first calibration signal CAL1 and a value of the bias voltage $V_{BIAS}$. The second summing circuit SUM2 produces the output signal having a value equal to a sum of a value of the second calibration signal CAL2 and the value of the bias voltage $V_{BIAS}$. A person of skill in the art in light of the teachings and disclosures herein would understand how to implement the first and second summing circuits SUM1 and SUM2.

When the auto-zero signal AZ has the high value, the first and second zeroing switches PZ1 and PZ2 are turned on. As a result, the first and second latch input signals LIN1 and LIN2 have values equal to the values of the output signals of the first and second summing circuits SUM1 and SUM2, being the sum of the values of the first calibration signal CAL1 and the bias voltage $V_{BIAS}$, and the sum of the values of the second calibration signal CAL2 and the bias voltage $V_{BIAS}$, respectively.

When the auto-zero signal AZ has the low value, the first and second zeroing switches PZ1 and PZ2 are turned off. As a result, the values of the first and second latch input signals LIN1 and LIN2 are determined according to voltage values of the second terminal of the first and second capacitors C1 and C2, respectively.

The bias voltage generation circuit 204 produces the bias voltage $V_{BIAS}$. The bias circuit 204 includes a first pMOSFET replica P1R and a current source CS.

A source of the first pMOSFET replica P1R is connected to a supply voltage VDD. A gate of the first pMOSFET replica P1R is connected to a drain of the first pMOSFET replica P1R and to a first terminal of the current source CS.

A second terminal of the current source CS is connected to a ground GND. The current source CS causes a reference current $I_{REF}$ to flow through the first pMOSFET replica P1R.

The flow of the reference current $I_{REF}$ through the first pMOSFET replica P1R produces the bias voltage $V_{BIAS}$ at the gate of the first pMOSFET replica P1R.

The first pMOSFET replica P1R is substantially identical to first and second pMOSFETs P1 and P2 of the first latch stage 2-206; that is, design parameters of the first pMOSFET replica P1R, including dimensions and doping profiles, are the same as design parameters of the first and second pMOSFETs P1 and P2. As a result, the bias voltage $V_{BIAS}$ produced at the gate of the first pMOSFET replica P1R by the flow of the reference current $I_{REF}$ is approximately equal to a voltage that, when provided to gates of the first and second pMOSFETs P1 and P2, will cause respective currents flowing through the first and second pMOSFETs P1 and P2 to be equal to the reference current $I_{REF}$.

In an embodiment, when a voltage substantially equal to the bias voltage $V_{BIAS}$ is provided to the respective gates of the first and second pMOSFETs P1 and P2, manufacturing and environmental variations may cause the respective currents flowing through the first and second pMOSFETs P1 and P2 to differ from each other and from the reference current $I_{REF}$. These manufacturing and environmental variations may be compensated for using the first and second calibration signals CAL1 and CAL2, as will be described below.

In an embodiment, the current source CS is a programmable current source. A value of the reference current $I_{REF}$ may be selected according to the speed and power requirements for the comparator circuit 2-110. For example, a larger value of the reference current $I_{REF}$ may be selected to increase the speed of the comparator circuit 2-110, or a smaller value of the reference current $I_{REF}$ may be selected to reduce the amount of power dissipated by the comparator circuit 2-110.

The first latch stage 2-206 includes the first and second pMOSFETs P1 and P2, and first, second, and third n-channel MOSFETs (nMOSFETs) N1, N2, and N3. The first latch stage 2-206 receives a clock signal CK and receives the first and second latch input signals LIN1 and LIN2 from the input circuit 202.

A drain of the first pMOSFET P1 is connected to a drain of the first nMOSFET N1 and a gate of the second nMOSFET N2. A drain of the second pMOSFET P2 is connected to a drain of the second nMOSFET N2 and a gate of the first nMOSFET N1. A person of skill in the art would recognize the first and second nMOSFETs N1 and N2 as being cross-coupled.

Sources of the first and second pMOSFETs P1 and P2 are connected to the supply voltage VDD. A person of skill in the art would recognize the first and second pMOSFETs P1 and P2 as not being cross-coupled.

Sources of the first and second nMOSFETs N1 and N2 are connected to each other and to a drain of the third nMOSFET N3. A source of the third nMOSFET N3 is connected to the ground GND. A gate of the third nMOSFET N3 receives the clock signal CK. The first and second nMOSFETs N1 and N2 form a first positive feedback circuit that is turned off and on using the third nMOSFET N3.

In an embodiment, the first and second pMOSFETs P1 and P2 have a substantially identical configuration; that is, dimensions, doping profiles, and other design parameters of the first and second pMOSFETs P1 and P2 are identical, and differences in characteristics between the first and second pMOSFETs P1 and P2 are results of uncontrolled variations of an operating environment, a manufacturing process, or both. In an embodiment, the first and second nMOSFETs N1 and N2 have a substantially identical configuration.

A third latch input signal LIN3 is produced at a first node connected to the drain of the first nMOSFET N1. A fourth latch input signal LIN4 is produced at a second node connected to the drain of the second nMOSFET N2.

The first and second pMOSFETs P1 and P2 are configured to reset the first latch stage 2-206 when the first positive feedback circuit is turned off, and to provide amplification by producing current flows according to voltage values of the first and second latch input signals LIN1 and LIN2, respectively, when the first positive feedback circuit is turned on.

That is, when the clock signal CK has a first value (i.e. a low value less than a threshold value of the third nMOSFET N3), the third nMOSFET N3 is turned off. Currents may flow through the first and second pMOSFETs P1 and P2 according to the voltage values of the first and second latch input signals LIN1 and LIN2. The currents flowing through the first and second pMOSFETs P1 and P2 cause voltage values of the third and fourth latch input signals LIN3 and LIN4 to increase towards the supply voltage VDD, thereby resetting the first latch stage 2-206.

When the clock signal CK has a second value (i.e. a high value greater than the threshold value of the third nMOSFET N3), the third nMOSFET N3 turns on and the first latch stage 2-206 operates as a differential latch and produces a first comparison result value on the third and fourth latch input signals LIN3 and LIN4, as will be explained in more detail below with reference to FIG. 3.

The second latch stage 208 includes the fourth and fifth nMOSFETs N4 and N5, and third, fourth, and fifth pMOSFETs P3, P4, and P5. The second latch stage 208 receives the clock signal CK through an inverter INV and the third and fourth latch input signals LIN3 and LIN4 from the first latch stage 2-206. Sources of the fourth and fifth nMOSFETs N4 and N5 are connected to the ground GND. A person of skill in the art would recognize the fourth and fifth nMOSFETs N4 and N5 as not being cross-coupled.

A drain of the fourth nMOSFETs N4 is connected to a drain of the fourth pMOSFET P4 and a gate of the fifth pMOSFET P5. A drain of the fifth nMOSFETs N5 is connected to a drain of the fifth pMOSFET P5 and a gate of the fourth pMOSFET P4. A person of skill in the art would recognize the fourth and fifth pMOSFETs P4 and P5 as being cross-coupled.

Sources of the fourth and fifth pMOSFETs P4 and P5 are connected to each other and to a drain of the third pMOSFET P3. A source of the third pMOSFET P3 is connected to the supply voltage VDD. A gate of the third pMOSFET P3 receives an inverted version of the clock signal CK from the inverter INV. The fourth and fifth pMOSFETs P4 and P5 form a second positive feedback circuit that is turned off and on using the third pMOSFET P3.

Set and reset signals SET and RST are produced at the drains of the fourth and fifth nMOSFET N4 and N5, respectively.

In an embodiment, the fourth and fifth nMOSFETs N4 and N5 are substantially identical. In an embodiment, the fourth and fifth pMOSFETs P4 and P5 are substantially identical.

The fourth and fifth nMOSFETs N4 and N5 are configured to reset the second latch stage 208 when the second positive feedback circuit is turned off, and to provide amplification by producing current flows according to voltage values of the third and fourth latch input signals LIN3 and LIN4, respectively, when the second positive feedback circuit is turned on.

That is, when the clock signal CK has the first value, the third pMOSFET P3 is turned off. Because the first latch stage 2-206 is reset by the first and second pMOSFETs P1 and P2 when the clock signal CK has the first value, the third and fourth latch input signals LIN3 and LIN4 have high voltage values and currents may flow through the fourth and fifth nMOSFETs N4 and N5. The currents flowing through the fourth and fifth nMOSFETs N4 and N5 cause voltage values of the set and reset signals SET and RST to decrease towards the ground GND, thereby resetting the second latch stage 208.

When the clock signal CK has the second value, the third pMOSFET P3 turns on, and the second latch stage 208 operates as a differential latch and produces a second comparison result value on the set and reset signals SET and RST, as will be explained in more detail below with reference to FIG. 3.

The set-reset latch SRL receives the set and reset signals SET and RST and produces the data out signal DOUT at an output Q according to values of the set and reset signals SET and RST. A person of skill in the art in light of the teachings and disclosures herein would understand how to implement the set-reset latch SRL.

Figure 3:
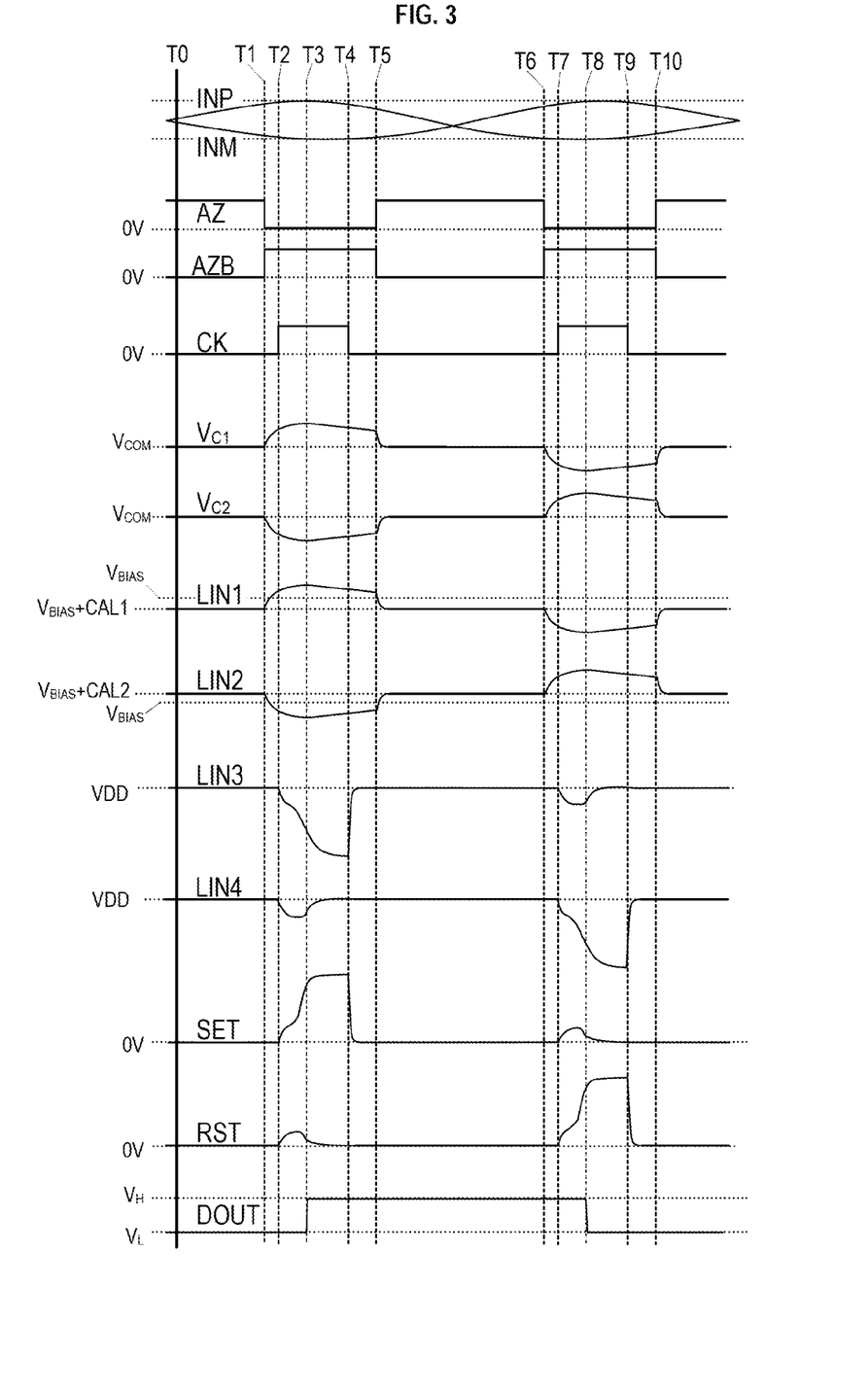
FIG. 3 is a waveform diagram illustrating an operation of the comparator circuit of FIG. 2 according to an embodiment.

FIG. 3 is a waveform diagram illustrating an operation of the comparator circuit 2-110 of FIG. 2 according to an embodiment.

At an initial time T0, a first auto-zero operation is being performed, and the auto-zero signal AZ has a high value and the auto-zero complement signal AZB has a low value. As a result, the second plus switch S2P, the second minus switch S2M, the first zeroing switch PZ1, and the second zeroing switch PZ2 are turned on, and the first plus switch S1P and the first minus switch S1M are turned off.

Voltage values $V_{C1}$ and $V_{C2}$ at the first terminals of the first and second capacitors C1 and C2 become equal to a value of the common voltage $V_{COM}$. A value of the first latch input signal LIN1 becomes equal to a sum of values of the first calibration signal CAL1 and the bias voltage $V_{BIAS}$. A value of the second latch input signal LIN2 becomes equal to a sum of values of the second calibration signal CAL2 and the bias voltage $V_{BIAS}$.

During the first auto-zero operation, the clock signal CK has a low value, and thus the third nMOSFET N3 and the third pMOSFET P3 are turned off. The first and second pMOSFETs P1 and P2 conduct, causing the third and fourth latch input signals LIN3 and LIN4 to have values equal to the supply voltage VDD, respectively, thereby resetting the first latch stage 2-206. The fourth and fifth nMOSFETs N4 and N5 conduct, causing the set and reset signals SET and RST to have low values substantially equal to a value of the ground GND, respectively, thereby resetting the second latch stage 208. Because the set and reset signals SET and RST both have the low values, the state of the set-reset latch SRL is not changed.

At a first time T1, the auto-zero signal AZ is changed to a low value and the auto-zero complement signal AZB to a high value, ending the first auto-zero operation and beginning a first sampling operation. As a result, the second plus switch S2P, the second minus switch S2M, the first zeroing switch PZ1, and the second zeroing switch PZ2 are turned off, and the first plus switch S1P and the first minus switch S1M are turned on.

Because the first plus switch S1P and the first minus switch S1M are turned on, the plus and minus input signals INP and INM are provided to the first terminals of the first and second capacitors C1 and C2, respectively. The first and second latch input signals LIN1 and LIN2 acquire values according to Equations 1 and 2, below:

$$LIN1 = (CAL1 + V_{BIAS}) + (INP - V_{COM}) \qquad \text{(Equation 1)}$$
$$= CALBIAS1 + (INP - V_{COM}),$$

$$LIN2 = (CAL2 + V_{BIAS}) + (INM - V_{COM}) \qquad \text{(Equation 2)}$$
$$= CALBIAS2 + (INP - V_{COM}),$$

wherein CAL1 and CAL2 are respective voltage values of the first and second calibration signals CAL1 and CAL2, $V_{BIAS}$ is a voltage value of the bias voltage $V_{BIAS}$, INP and INM are respective voltage values of the plus and minus input signals INP and INM, $V_{COM}$ is a voltage value of the common voltage $V_{COM}$, CALBIAS1 is a voltage value of a sum of the voltage values of the first calibration signal CAL1 and the bias voltage $V_{BIAS}$, and CALBIAS2 is a voltage value of a sum of the voltage values of the second calibration signal CAL2 and the bias voltage $V_{BIAS}$.

In an embodiment, the voltage value of the common voltage $V_{COM}$ is selected to be between highest and lowest voltages of the plus and minus input signals INP and INM.

At a second time T2, the clock signal CK changes to have a high value, and the third nMOSFET N3 and the third pMOSFET P3 are turned on. Because the third and fourth latch input signals LIN3 and LIN4 have high values at the second time T2, the first and second nMOSFETs N1 and N2 are also turned on.

Therefore, first and second currents $I_{P1}$ and $I_{P2}$ flow through the first and second pMOSFETs P1 and P2, respectively, according to Equations 3 and 4:

$$I_{P1} = g_1 \cdot ((VDD - LIN1) - V_{TH1}), (VDD - LIN1) \geq V_{TH1}, \qquad \text{(Equation 3)}$$

$$I_{P2} = g_2 \cdot ((VDD - LIN2) - V_{TH2}), (VDD - LIN2) \geq V_{TH2}, \qquad \text{(Equation 4)}$$

wherein $V_{TH1}$ and $V_{TH2}$ are respective first and second threshold voltages of the first and second pMOSFETs P1 and P2, $g_1$ and $g_2$ are respective first and second transconductances of the first and second pMOSFETs P1 and P2, and VDD is a voltage value of the supply voltage VDD.

In an embodiment, values of the first and second calibration signals CAL1 and CAL2 are determined according to a calibration procedure that produces first and second currents $I_{P1}$ and $I_{P2}$ flowing through the first and second pMOSFETs P1 and P2, respectively, that are substantially equal to each other when the plus and minus input signals INP and INM are both substantially equal to the common voltage $V_{COM}$, so that Equation 5 is satisfied:

$$I_{CAL} = g_1 \cdot ((VDD - (CAL1 + V_{BIAS})) - V_{TH1}) \qquad \text{(Equation 5)}$$
$$\cong g_2 \cdot ((VDD - (CAL2 + V_{BIAS})) - V_{TH2}),$$

wherein $I_{CAL}$ is the value of the first current $I_{P1}$ when the calibration is accomplished.

Combining Equations 1 through 5 then results in Equations 6 and 7:

$$I_{P1} \cong g_1 \cdot (V_{COM} - \text{INP}) + I_{CAL} \qquad \text{(Equation 6)}$$

$$I_{P2} \cong g_2 \cdot (V_{COM} - \text{INM}) + I_{CAL} \qquad \text{(Equation 7)}.$$

As can be seen from Equations 6 and 7, as a result of the calibration procedure, the first and second currents $I_{P1}$ and $I_{P2}$ vary in inverse proportion to the voltage values of the plus and minus input signals INP and INM, respectively. As a result, because the voltage value of the plus input signal INP is greater than the voltage value of the minus input signal INM at the second time T2, the value of the first current $I_{P1}$ is less than the value of the second current $I_{P2}$ at the second time T2.

The value of the first current $I_{P1}$ being less than the value of the second current $I_{P2}$ causes a voltage value of the third latch input signal LIN3 to decrease more rapidly than the voltage value of the fourth latch input signal LIN4, that is, amplifying a difference between the voltage values of the third and fourth latch input signals LIN3 and LIN4. As the voltage value of the third latch input signal LIN3 drops further below the voltage value of the fourth latch input signal LIN4, an on resistance value of the second nMOSFET N2 becomes increasingly greater than an on resistance value of the first nMOSFET N1.

The changes in the on resistances values of the first and second nMOSFETs N1 and N2 create a positive feedback loop that accelerates the decrease in the voltage value of the third latch input signal LIN3 and, starting at a time between the second time T2 and a third time T3, causes an increase in the voltage value of the fourth latch signal LIN4.

When the voltage value of the fourth latch signal LIN4 is greater than the voltage value of the third latch signal LIN3 after the second time T2, the value of a fourth current $I_{N5}$ flowing through the fifth nMOSFET N5 is greater than the value of a third current $I_{N4}$ flowing through the fourth nMOSFET N4. As a result, a voltage value of the set signal SET increases more rapidly than a voltage value of the reset signal RST. As the voltage value of the set signal SET rises further above the voltage value of the reset signal RST, an on resistance value of the fifth pMOSFET P5 becomes increasingly greater than an on resistance value of the fourth pMOSFET N4.

The changes in the on resistances values of the fourth and fifth pMOSFETs P4 and P5 create a positive feedback loop that accelerates the increase in the voltage value of the set signal SET and, starting at a time between the second time T2 and the third time T3, causes a decrease in the voltage value of the reset signal RST.

At the third time T3, the voltage value of the set signal SET exceeds a threshold value of the set-reset latch SRL, and thus the value at the output Q of the set-reset latch SRL becomes a high value, resulting in the value of the data out signal DOUT becoming a high value.

At a fourth time T4, the voltage value of the clock signal CK is changed to a low value, ending the first sampling operation. As a result, the third nMOSFET N3 and the third pMOSFET P3 are turned off, the first and second pMOSFETs P1 and P2 cause the voltage values of the third and fourth latch input signals LIN3 and LIN4 to return to the value of the supply voltage VDD, and the fourth and fifth nMOSFETs N4 and N5 cause the voltage values of the set signal SET and the reset signal RST to return to the value of the ground GND. That is, the first latch stage 2-206 and the second latch stage 208 are reset.

At a fifth time T5, the auto-zero signal AZ becomes a high value and the auto-zero complement signal AZB becomes a low value, and thus starts a second auto-zero operation similar to the first auto-zero operation described above.

At a sixth time T6, the auto-zero signal AZ is changed to a low value and the auto-zero complement signal AZB to a high value, ending the second auto-zero operation and beginning a second sampling operation. The second sampling operation proceeds similarly to the first sampling operation that began at the first time T1, with seventh through tenth times T7 through T10 corresponding to the second through fifth times T2 through T5, respectively.

However, during the second sampling operation, instead of the voltage value of the plus input signal INP being greater than the voltage value of the minus input signal INM, the voltage value of the minus input signal INM is greater than the voltage value of the plus input signal INP. The comparator circuit 2-110 operates symmetrically, so that during the second sampling operation the voltage value of the reset signal RST becomes a high value and the value of the data out signal DOUT becomes a low value.

Figure 4:
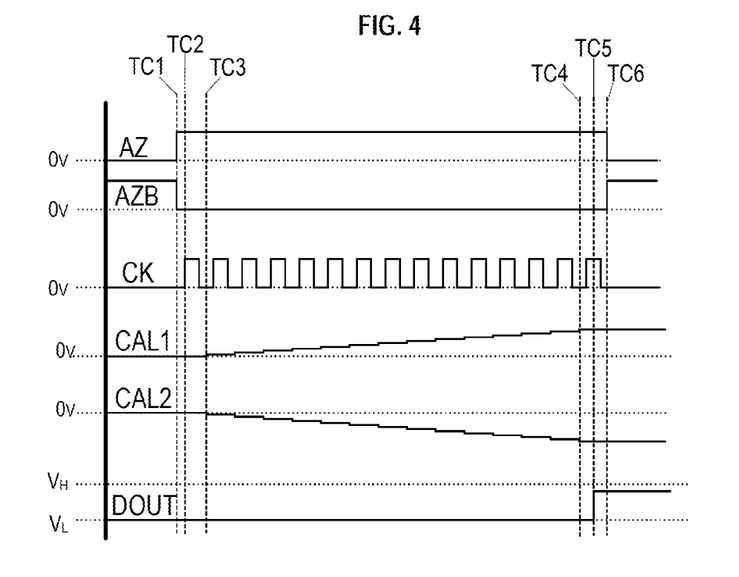
FIG. 4 is a waveform diagram illustrating a calibration operation of the comparator circuit of FIG. 2 according to an embodiment.

FIG. 4 is a waveform diagram illustrating a calibration operation of the comparator circuit 2-110 of FIG. 2 according to an embodiment. The calibration operation determines values for the first and second calibration signals CAL1 and CAL2, provided by the calibration circuit 106 of FIG. 1A, that compensate for a difference between values of respective first and second threshold voltages $V_{TH1}$ and $V_{TH2}$ of the first and second pMOSFETs P1 and P2.

At a first calibration time TC1, a calibration process begins. The auto-zero signal AZ has a high value, the auto-zero complement signal AZB has a low value, and the clock signal CK has a low value. The clock having the low value causes the first and second pMOSFETs P1 and P2 to reset the first latch stage 2-206, and causes the fourth and fifth nMOSFETs N4 and N5 to reset the second latch stage 208. The first and second calibration signals CAL1 and CAL2 each have a value of 0 volts.

The auto-zero complement signal AZB having the low value turns on the first and second zeroing switches PZ1 and PZ2. As a result, voltage values of the first and second latch input signals LIN1 and LIN2 are equal to a sum of the voltage value of the bias voltage $V_{BIAS}$ and the voltage values of the first and second calibration signals CAL1 and CAL2, respectively. Because the first and second calibration signals CAL1 and CAL2 each have a value of 0 volts at the first calibration time TC1, the values of the first and second latch input signals LIN1 and LIN2 are each equal to the value of the bias voltage $V_{BIAS}$.

At a second calibration time TC2, a value of the clock signal CK becomes a high value. The clock signal CK having the high value turns on the third nMOSFET N3 and the third pMOSFET P3, and currents may then flow through the first and second latch stages 2-206 and 208.

In the example shown, the first threshold voltage $V_{TH1}$ of the first pMOSFET P1 is lower the second threshold voltages $V_{TH2}$ of the second pMOSFET P2. As a result, when the voltage values of the first and second latch input signals LIN1 and LIN2 are the same, a first current $I_{P1}$ flowing through the first pMOSFET P1 will be larger than a second current $I_{P2}$ flowing through the second pMOSFET P2. As described above in relation to the second sampling operation shown in FIG. 3, this difference in the values of the first and second currents $I_{P1}$ and $I_{P2}$ will cause the reset signal RST to have a high value, which will cause the data out signal DOUT to have a low value.

At a third calibration time TC3, the clock signal CK has returned to the low value. The first and second pMOSFETs P1 and P2 operate to reset the first latch stage 2-206, and the fourth and fifth nMOSFETs N4 and N5 operate to reset the second latch stage 208. The calibration circuit 106 receives the data out signal DOUT. When the data out signal DOUT has a low value at the third calibration time TC3, as shown in the example of FIG. 4, the calibration circuit 106 increases the voltage value of the first calibration signal CAL1 and decreases the voltage value of the second calibration signal CAL2. When the data out signal DOUT has a high value at the third calibration time TC3, not shown, the calibration circuit 106 decreases the voltage value of first calibration signal CAL1 and increases the voltage value of the second calibration signal CAL2.

The operations performed at the second and third calibration times TC2 and TC3 are performed during each successive cycle of the clock cycle CK as long as the value of the data out signal DOUT remains unchanged, that is, as long as a magnitude of a difference between the values of the first and second threshold voltages $V_{TH1}$ and $V_{TH2}$ is greater than a magnitude of a difference between the values of the first and second calibration signals CAL1 and CAL2.

At a fourth calibration time TC4, the calibration circuit 106 increases the voltage value of the first calibration signal CAL1 and decreases the voltage value of the second calibration signal CAL2 to values having a difference with a magnitude greater than the magnitude of the difference between the values of the first and second threshold voltages $V_{TH1}$ and $V_{TH2}$.

As a result, at a fifth calibration time TC5 after the next change of the value of the clock signal CK to the high value, the first current $I_{P1}$ flowing through the first pMOSFET P1 will be smaller than the second current $I_{P2}$ flowing through the second pMOSFET P2. As described above in relation to the first sampling operation shown in FIG. 3, this difference in the values of the first and second currents $I_{P1}$ and $I_{P2}$ will cause the set signal SET to have a high value, which will cause the data out signal DOUT to have a high value.

At a sixth calibration time TC6, the calibration circuit 106 detects a change in the value of the data out signal DOUT. When the calibration circuit 106 detects the change in the value of the data out signal DOUT, the calibration circuit 106 ends the calibration process, and the voltage values of the first and second calibration signals CAL1 and CAL2 at the fifth calibration time TC5 are used in subsequent sampling operations. The voltage values of the first and second calibration signals CAL1 and CAL2 at the fifth calibration time TC5 substantially satisfy Equation 5, above.

A person of skill in the art in light of the teachings and disclosures herein would understand how to implement a calibration circuit 106 of FIG. 1 configured to perform the calibration operation described above.

Figure 5:
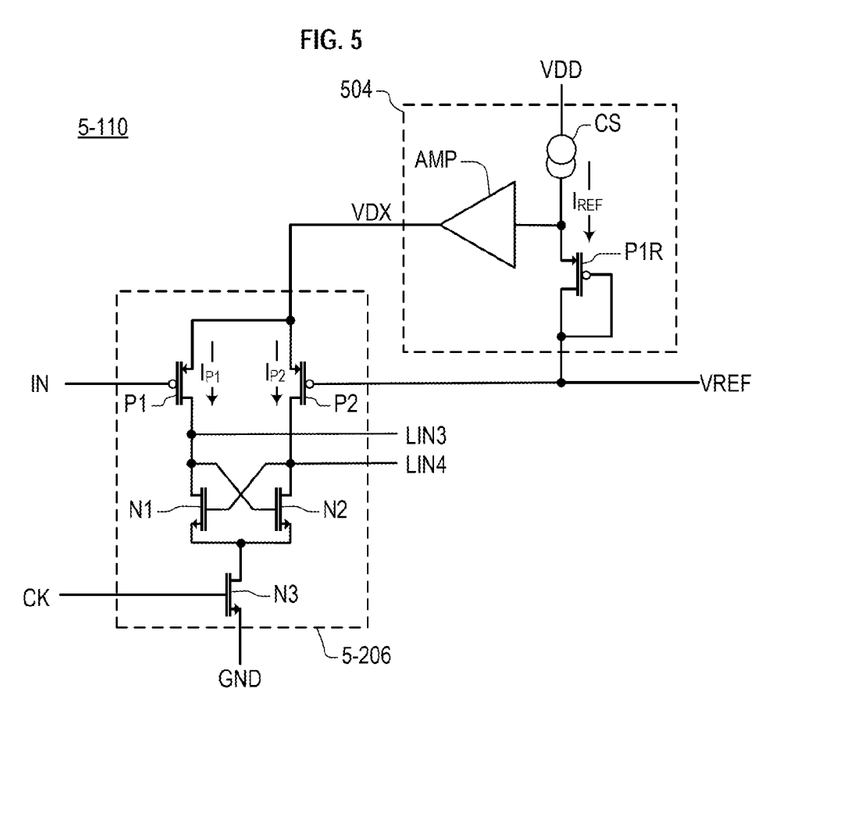
FIG. 5 is a circuit diagram of a comparator circuit suitable for use in the electronic devices of FIGS. 1A and 1B, according to an embodiment.

FIG. 5 is a schematic of a comparator circuit 5-110 suitable for use as the comparator 1-110A of FIG. 1A or as the comparator 1-110B of FIG. 1B, according to an embodiment. The comparator circuit 5-110 may also be used in place of the input circuit 202, the bias voltage generation circuit 204, and the first latch stage 2-206 in the comparator circuit 2-110 of FIG. 2. The comparator circuit 5-110 includes a latch supply voltage circuit (or a supply voltage circuit) 504 and a clocked positive feedback latch stage (or latch stage) 5-206.

The latch supply voltage circuit 504 produces a latch supply voltage (or a power supply voltage) VDX. The latch supply voltage circuit 504 includes a current source CS, a first pMOSFET replica P1R, and a unity-gain amplifier AMP.

A first terminal of the current source CS is connected to a supply voltage VDD. A second terminal of the current source CS is connected to a source of the first pMOSFET replica P1R and to an input of the unity-gain amplifier AMP. A gate of the first pMOSFET replica P1R is connected to a drain of the first pMOSFET replica P1R and to a reference voltage VREF.

The current source CS causes a reference current $I_{REF}$ to flow through the first pMOSFET replica P1R. The flow of the reference current $I_{REF}$ through the first pMOSFET replica P1R produces a voltage value at the input of the unity-gain amplifier AMP equal to a sum of a value of the reference voltage VREF and a value of a voltage drop across the first pMOSFET replica P1R.

In an embodiment, the current source CS is a programmable current source. A value of the reference current $I_{REF}$ may be selected according to the speed and power requirements for the comparator circuit 5-110. For example, a larger value of the reference current $I_{REF}$ may be selected to increase the speed of the comparator circuit 5-110, or a smaller value of the reference current $I_{REF}$ may be selected to reduce the amount of power dissipated by the comparator circuit 5-110.

The unity-gain amplifier AMP is configured to produce, at an output of the unity-gain amplifier AMP, the latch supply voltage VDX having a voltage value equal to the voltage value at the input of the unity-gain amplifier AMP. The latch supply voltage VDX is provided to sources of the first and second pMOSFETs P1 and P2. A person of skill in the art in light of the teachings and disclosures herein would understand how to implement the unity-gain amplifier AMP.

The first pMOSFET replica P1R is substantially identical to first and second pMOSFETs P1 and P2 of the latch stage 5-206. As a result, when a gate voltage of the first and second pMOSFETs P1 and P2 is equal to the value of the reference voltage VREF, currents flowing through the first and second pMOSFETs P1 and P2, respectively, have magnitudes substantially equal to a magnitude of the reference current $I_{REF}$.

The latch stage 5-206 includes the first and second pMOSFETs P1 and P2, and first, second, and third n-channel MOSFETs (nMOSFETs) N1, N2, and N3. The latch stage 5-206 receives a clock signal CK, an input signal IN, and the reference voltage VREF.

A gate of the first pMOSFET P1 receives the input signal IN. A drain of the first pMOSFET P1 is connected to a drain of the first nMOSFET N1 and a gate of the second nMOSFET N2. A gate of the second pMOSFET P2 receives the reference voltage VREF. A drain of the second pMOSFET P2 is connected to a drain of the second nMOSFET N2 and a gate of the first nMOSFET N1.

Sources of the first and second nMOSFETs N1 and N2 are connected to each other and to a drain of the third nMOSFET N3. A source of the third nMOSFET N3 is connected to the ground GND. A gate of the third nMOSFET N3 receives the clock signal CK.

A third latch input signal LIN3 is produced at the drain of the first nMOSFET N1. A fourth latch input signal LIN4 is produced at the drain of the second nMOSFET N2. The first, second, and third n-channel MOSFETs (nMOSFETs) N1, N2, and N3 form an enable-able positive feedback circuit that, when turned on, amplifies a difference in voltage values of the third and fourth latch input signal LIN3 and LIN4.

The first and second pMOSFETs P1 and P2 are configured to reset the latch stage 5-206 when the positive feedback circuit is turned off, and to provide amplification by producing current flows according to voltage values of the input signal IN and reference voltage VREF, respectively, when the positive feedback circuit is turned on.

That is, when the clock signal CK has a first value (i.e. a low value less than a threshold value of the third nMOSFET N3), the third nMOSFET N3 is turned off. Currents may flow through the first and second pMOSFETs P1 and P2 according to the voltage values of input signal IN and the reference voltage VREF. The currents flowing through the first and second pMOSFETs P1 and P2 cause voltage values of the third and fourth latch input signals LIN3 and LIN4 to increase towards the supply voltage VDD, thereby resetting the latch stage 5-206.

When the clock signal CK has a second value (i.e. a high value greater than a threshold value of the third nMOSFET N3), the third nMOSFET N3 turns on and the first latch stage 5-206 operates as a differential latch and produces a first comparison result value on the third and fourth latch input signals LIN3 and LIN4, as described above for the first latch stage 2-206 of FIG. 2.

In an embodiment, the first and second pMOSFETs P1 and P2 have a substantially identical configuration. In an embodiment, the first and second nMOSFETs N1 and N2 have a substantially identical configuration.

The embodiments shown in FIGS. 2 and 5 are shown using MOSFETs, wherein gates of the MOSFETs operate as control terminals, and wherein sources and drains of the MOSFETs operate as first and second conduction terminals. However, embodiments are not limited thereto, and a person of skill in the art in light of the teachings and disclosures herein would understand that a variety of other gain-providing electronic devices having a control terminal and first and second conduction terminals, including other types of transistors such as Junction FETs (JFETs), bipolar junction transistors (BJTs), and the like, may be used in place of some or all of the MOSFETs shown in FIGS. 2 and 5.

Figure 6:
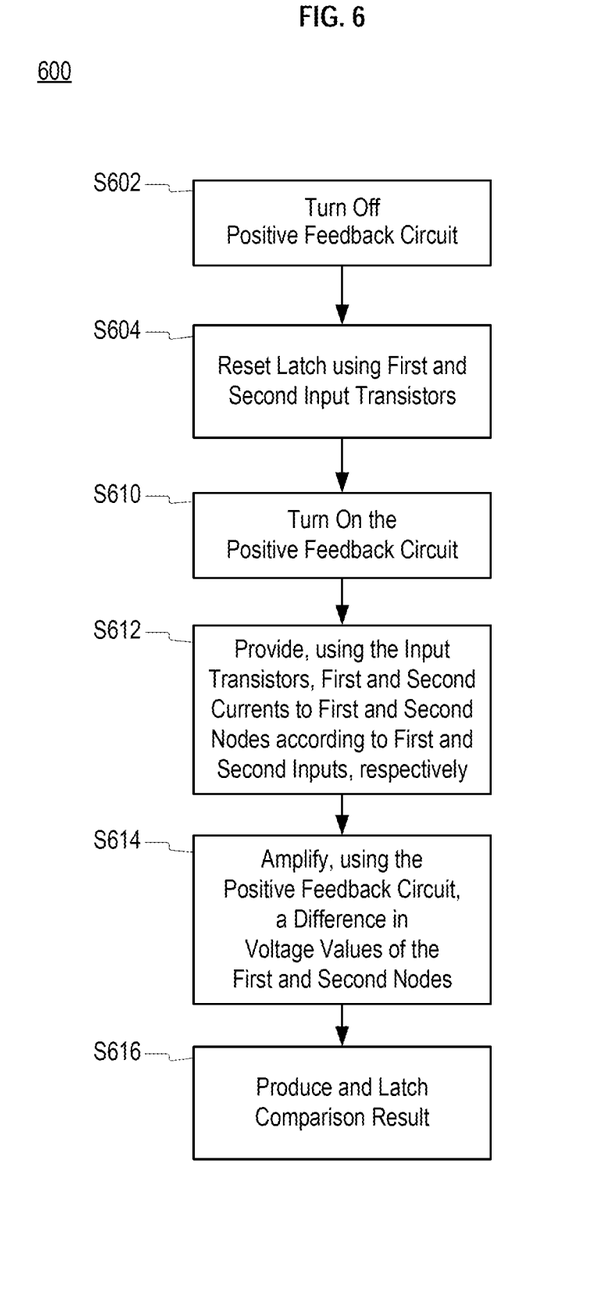
FIG. 6 is a flowchart of a process for comparing two analog signals, according to an embodiment.

FIG. 6 is a flowchart of a process 600 for comparing two input signals using a clocked positive feedback latch circuit (or latch circuit), according to an embodiment. The latch circuit includes first and second input transistors and a positive feedback circuit. First and second nodes of the latch circuit are connected to the first and second input transistors, respectively, and to the positive feedback circuit. One or more output signals of the latch circuit are connected to one or more of the first and second nodes.

At S602, the positive feedback circuit is turned off. When the positive feedback circuit is turned off, transistors of in the positive feedback circuit do not sink or source current to the first and second nodes. In an embodiment, the positive feedback circuit is turned off by turning off an enable transistor connected between the positive feedback circuit and a first power supply signal, such as a supply voltage signal or a ground signal.

At S604, when the positive feedback circuit is turned off, the first and second input transistors reset the latch circuit by providing first and second currents to the first and second nodes. The first and second currents cause the first and second nodes to have a voltage value equal to a first reset voltage value. In an embodiment, the first reset voltage value is substantially equal to a voltage value of a second power supply signal connected to the first and second input transistors.

In an embodiment, the first and second input transistors provide the one or more currents according to first and second bias voltage values included in first and second input signals of the latch circuit.

In another embodiment, the first and second input transistors provide the one or more currents according to a difference between voltage values of the first and second input signals and a voltage value of a latch supply voltage signal provided to the first and second input transistors. In an embodiment, a latch supply voltage circuit provides the latch supply voltage signal having the voltage value that produces, in the first and second input transistors respectively, first and second currents substantially equal to a predetermined reference current when a predetermined reference voltage is provided to the first and second inputs of the latch circuit. In an embodiment, the latch supply voltage circuit provides the latch supply voltage signal using a replica transistor that is substantially identical to the first input transistor, the second input transistor, or both.

In another embodiment, the latch circuit is a first latch circuit, and the first and second input transistors provide the one or more currents according to second reset voltage values provided by first and second output signals of a second latch circuit respectively connected to the first and second input signals of the first latch circuit.

At S610, the positive feedback circuit is turned on. In an embodiment, the positive feedback circuit is turned on by turning on the enable transistor connected between the positive feedback circuit and the first power supply signal.

In an embodiment, the positive feedback circuit consists of first and second cross-coupled transistors. The first and second cross-coupled transistors have a first conductivity type different from a second conductivity type of the first and second input transistors. For example, in an embodiment, the first and second input transistors may be p-channel FETs, and the first and second cross-coupled transistors may by n-channel FETs. In another embodiment, the first and second input transistors may be n-channel FETs, and the first and second cross-coupled transistors may be p-channel FETs.

At S612, the first and second input transistors provide first and second currents to the first and second nodes according to voltage values of the first and second inputs of the latch circuit, respectively. A difference in the respective voltage values of the first and second nodes is produced according to a difference between the first and second currents.

In an embodiment, the first and second inputs are provided according to first and second received signals, respectively, and a bias voltage. The bias voltage may have a value according to a reference current flowing through a replica transistor, wherein the replica transistor is substantially identical to the first and second input transistors.

At S614, the turned-on positive feedback circuit provides third and fourth currents to the first and second nodes according to the voltage values of the second and first nodes, respectively. The positive feedback circuit operates to provide positive feedback that increases the difference in the voltage values of the first and second nodes.

At S616, the positive feedback provided by the positive feedback circuit produces comparison result values on the first and second nodes according to the relative voltage values of the first and second input signals. The comparison result values are retained, that is, latched, on the first and second nodes until the process 600 is repeated starting at S602.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. An apparatus comprising:
a first input transistor having a control terminal configured to receive a first input signal;
a second input transistor having a control terminal configured to receive a second input signal;
a feedback circuit coupled to the first and second input transistors; and
first and second cross-coupled transistors configured to provide positive feedback,
wherein the first and second cross-coupled transistors are part of the feedback circuit,
wherein the feedback circuit is a positive feedback circuit,
wherein the first and second input transistors are configured to provide, to first and second nodes, first and second currents according to values of the first and second input signals, respectively, when the feedback circuit is turned on, and
wherein the first and second input transistors are configured to produce a reset value on the first and second nodes, respectively, when the feedback circuit is turned off.

2. The apparatus of claim 1, further comprising:
an enable transistor configured to control whether the feedback circuit is turned on or turned off.

3. The apparatus of claim 2,
wherein the first and second input transistors are first conductivity type transistors,
wherein the first and second cross-coupled transistors are second conductivity type transistors, and
wherein the first conductivity type is different from the second conductivity type.

4. The apparatus of claim 1, wherein the reset value corresponds to a voltage value of a supply voltage provided to the first and second input transistors.

5. The apparatus of claim 1, wherein the first input signal has a value according to a bias voltage and a first received signal, and wherein the second input signal has a value according to the bias voltage and a second received signal.

6. The apparatus of claim 5, wherein the first input signal has a value according to a first calibration signal.

7. The apparatus of claim 5, wherein the bias voltage is produced using a first transistor replica that is substantially identical to the first input transistor.

8. The apparatus of claim 7, wherein the bias voltage is produced using a programmable current source coupled to the first transistor replica.

9. The apparatus of claim 1, further comprising a supply voltage circuit configured to provide, to the first and second input transistors, a power supply voltage having a voltage value according to a voltage value of the second input signal and a value of a reference current.

10. The apparatus of claim 9,
wherein a value of the power supply voltage is equal to a sum of the voltage value of the second input signal and a voltage drop across a first replica transistor,
wherein the voltage drop across the first replica transistor is produced according to the value of the reference current, and
wherein the first replica transistor is substantially identical to the second input transistor.

11. The apparatus of claim 9, wherein the voltage value of the second input signal is a reference voltage value.

12. The apparatus of claim 1, wherein the feedback circuit is a first positive feedback circuit, and wherein the reset value is a first reset value, the apparatus further comprising:
a third input transistor having a control terminal configured to receive a first output signal from the first node of the first positive feedback circuit;
a fourth input transistor having a control terminal configured to receive a second output signal from the second node of the first positive feedback circuit; and
a second positive feedback circuit coupled to the third and fourth input transistors and configured to be turned on and turned off,
wherein the third and fourth input transistors are configured to provide, to third and fourth nodes, third and fourth currents according to values of the first and second output signals, respectively, when the second positive feedback circuit is turned on,
wherein the third and fourth input transistors are configured to produce a second reset value on the third and fourth nodes when the second positive feedback circuit is turned off,
wherein the first and second input transistors are first conductivity type transistors,
wherein the third and fourth input transistors are second conductivity type transistors, and
wherein the first conductivity type is different from the second conductivity type.

13. The apparatus of claim 1, wherein the apparatus is included in a Serializer/Deserializer (SERDES) receiver circuit.

14. The apparatus of claim 1, wherein the apparatus is included in an Analog to Digital Converter (ADC) circuit.

15. A method comprising:
resetting, using first and second input transistors, respectively, values of first and second nodes to a reset value;
providing first and second currents to the first and second nodes, using the first and second input transistors, respectively, according to values of first and second input signals applied to control terminals of the first and second input transistors; and
determining the values of the first and second nodes according to the values of the first input signal and the second input signal;
turning off a positive feedback circuit; and
turning on the positive feedback circuit,
wherein the positive feedback circuit is coupled to the first and second input transistors.

16. A method comprising:
resetting, using first and second input transistors, respectively, values of first and second nodes to a first reset value;
providing first and second currents to the first and second nodes, using the first and second input transistors, respectively, according to values of first and second input signals applied to control terminals of the first and second input transistors; and
determining the values of the first and second nodes according to the values of the first input signal and the second input signal, wherein the values of the first and second nodes are determined based on whether the value of the first input signal is greater than the value of the second input signal;
resetting values of third and fourth nodes to a second reset value using third and fourth input transistors, respectively;

providing, using the third and fourth input transistors, respectively, third and fourth currents to the third and fourth nodes according to the values of the first and second nodes; and determining the values of the third and fourth nodes according to whether the value of the first input signal is greater than the value of the second input signal.

17. The method of claim 16, wherein the first and second input transistors are a first conductivity type transistors, the third and fourth input transistors are a second conductivity type transistors, and the first conductivity type is different from the second conductivity type.

18. The method of claim 15, wherein the values of the first and second output signals are reset when the positive feedback circuit is off, and wherein the first and second currents are provided to the first and second nodes and the values of the first and second nodes are determined according to whether the value of the first input signal is greater than the value of the second input signal when the positive feedback circuit is on.

19. The method of claim 15, further comprising providing the first and second input signals according to first and second received signals, respectively, and a bias voltage.

20. The method of claim 15, further comprising:

determining a voltage value of a power supply signal according to a value of the second input signal and a voltage value of a bias voltage; and providing the power supply signal to conduction terminals of the first and second input transistors.

* * * * *